US012563920B2

(12) United States Patent
Wu et al.

(10) Patent No.:  US 12,563,920 B2
(45) Date of Patent:  Feb. 24, 2026

(54) DISPLAY PANEL AND MANUFACTURING METHOD THEREOF, AND DISPLAY DEVICE

(71) Applicants: Chongqing BOE Display Technology Co., Ltd., Chongqing (CN); BOE TECHNOLOGY GROUP CO., LTD., Beijing (CN)

(72) Inventors: Xinwei Wu, Beijing (CN); Wei Zhang, Beijing (CN); Yanyan Xu, Beijing (CN); Cunzhi Li, Beijing (CN); Jonguk Kwak, Beijing (CN); Ning Zhao, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 654 days.

(21) Appl. No.: 17/920,156

(22) PCT Filed: Nov. 23, 2021

(86) PCT No.: PCT/CN2021/132565
§ 371 (c)(1),
(2) Date: Oct. 20, 2022

(87) PCT Pub. No.: WO2022/242081
PCT Pub. Date: Nov. 24, 2022

(65) Prior Publication Data
US 2024/0224640 A1     Jul. 4, 2024

(30) Foreign Application Priority Data
May 21, 2021    (CN) .......................... 202110557443.0

(51) Int. Cl.
*H10K 59/131*      (2023.01)
*H10K 59/12*       (2023.01)

(52) U.S. Cl.
CPC ....... *H10K 59/131* (2023.02); *H10K 59/1201* (2023.02)

(58) Field of Classification Search
None
See application file for complete search history.

(56) References Cited

U.S. PATENT DOCUMENTS

2017/0352534 A1*  12/2017  Liu ...................... H10D 86/421
2018/0217393 A1    8/2018  Richards et al.

FOREIGN PATENT DOCUMENTS

| CN | 110599963 A | 12/2019 |
| CN | 111584610 A | 8/2020 |
| CN | 113299712 A | 8/2021 |

* cited by examiner

*Primary Examiner* — Khaja Ahmad
(74) *Attorney, Agent, or Firm* — XSENSUS LLP

(57)                ABSTRACT
A display panel includes a base substrate, an active pattern layer and a first conductive layer. The active pattern layer is disposed on the base substrate, and includes at least one first conductive connection line. The first conductive layer is disposed on a side of the active pattern layer away from the base substrate. The first conductive layer includes at least one connection line extending along a first direction, and a plurality of initialization signal lines arranged along the first direction and extending along a second direction. An end of each initialization signal line is coupled to a connection line in the at least one connection line. The first direction and the second direction intersect. A first conductive connection line in the at least one first conductive connection line is coupled to at least two initialization signal lines that are coupled to a same connection line.

20 Claims, 14 Drawing Sheets aa                   bb

CL                   CL

10

10

100

Active pattern layer 110
First conductive layer 120
Third conductive layer 140

A-A'

Vint
Re
G
Cst2
EM

Form an active pattern layer on a base substrate — S1

Form a first conductive layer on a side of the active pattern layer away from the base substrate — S2

DISPLAY PANEL AND MANUFACTURING METHOD THEREOF, AND DISPLAY DEVICE

CROSS-REFERENCE TO RELATED APPLICATIONS

This application is a national phase entry under 35 USC 371 of International Patent Application No. PCT/CN 2021/132565 filed on Nov. 23, 2021, which claims priority to Chinese Patent Application No. 202110557443.0, filed on May 21, 2021, which are incorporated herein by reference in their entirety.

TECHNICAL FIELD

The present disclosure relates to the field of display technologies, and in particular, to a display panel and a manufacturing method thereof, and a display device.

BACKGROUND

Display panels can be classified into various types according to different display principles. For example, an organic light-emitting diode (OLED) display panel may include a plurality of OLED devices each containing an organic light-emitting material. The organic light-emitting material is capable of emitting light under a drive of an electric signal. By adjusting a magnitude of an electrical signal for driving a corresponding OLED device, a light-emitting brightness of the OLED device may be changed, so that the OLED display panel is capable of displaying image(s).

SUMMARY

In a first aspect, a display panel is provided. The display panel includes a base substrate, an active pattern layer and a first conductive layer. The active pattern layer is disposed on the base substrate, and includes at least one first conductive connection line. The first conductive layer is disposed on a side of the active pattern layer away from the base substrate. The first conductive layer includes at least one connection line extending along a first direction, and a plurality of initialization signal lines arranged along the first direction and extending along a second direction. An end of each initialization signal line is coupled to a connection line in the at least one connection line. The first direction and the second direction intersect. A first conductive connection line in the at least one first conductive connection line is coupled to at least two initialization signal lines, and the at least two initialization signal lines are coupled to a same connection line.

In some embodiments, the at least one first conductive connection line includes a plurality of first conductive connection lines. Each first conductive connection line is coupled to at least two initialization signal lines that are coupled to a same connection line.

In some embodiments, the display panel has a through hole. The plurality of initialization signal lines include a plurality of first initialization signal lines, and another end of each first initialization signal line extends to the through hole. The first conductive connection line is coupled to at least two first initialization signal lines, and the at least two first initialization signal lines are coupled to the same connection line.

In some embodiments, the at least one connection line includes two connection lines arranged opposite to each other. The plurality of initialization signal lines further include a plurality of second initialization signal lines arranged along the first direction and extending along the second direction. Two ends of each second initialization signal line are respectively coupled to the two connection lines. Each first conductive connection line is coupled to at least one second initialization signal line.

In some embodiments, the active pattern layer further includes at least one second conductive connection line, and each second conductive connection line is coupled to at least two second initialization signal lines.

In some embodiments, the display panel further includes at least one first connection pattern disposed on a side of the first conductive layer away from the base substrate. The first conductive connection line and an initialization signal line in the at least two initialization signal lines are coupled through a first connection pattern in the at least one first connection pattern.

In some embodiments, a coupling point where the first connection pattern and the initialization signal line are coupled is located at a position where the first conductive connection line coupled to the first connection pattern and the initialization signal line cross.

In some embodiments, the first conductive connection line extends along the first direction, and is in a shape of a straight strip.

In some embodiments, the display panel further includes a second conductive layer disposed between the base substrate and the active pattern layer. The second conductive layer includes at least one conductive line extending along a third direction. A conductive line in the at least one conductive line and an initialization signal line in the plurality of initialization signal lines are coupled through at least two coupling points.

In some embodiments, the third direction is parallel to the second direction.

In some embodiments, the display panel further includes at least one second connection pattern disposed on a side of the first conductive layer away from the base substrate. The conductive line and the initialization signal line are coupled through a second connection pattern in the at least one second connection pattern.

In some embodiments, the first conductive connection line, the initialization signal line and the conductive line are coupled through the second connection pattern.

In some embodiments, the active pattern layer further includes a plurality of active layers. The second conductive layer further includes a plurality of light-shielding patterns. An orthographic projection of an active layer in the plurality of active layers on the base substrate is located within an orthographic projection of a light-shielding pattern in the plurality of light-shielding patterns on the base substrate.

In some embodiments, the display panel further includes power signal lines disposed on a side of the first conductive layer away from the base substrate. The plurality of light-shielding patterns are coupled to the power signal lines.

In some embodiments, the display panel further includes a third connection pattern disposed on a side of the first conductive layer away from the base substrate. The third connection pattern is configured to be coupled to each first initialization signal line.

In a second aspect, a display device is provided. The display device includes the display panel in any one of the above embodiments.

In a third aspect, a manufacturing method of a display panel is provided. The manufacturing method includes: forming an active pattern layer on a base substrate, the active pattern layer including at least one first conductive connection line; and forming a first conductive layer on a side of the active pattern layer away from the base substrate. The first conductive layer includes at least one connection line extending along a first direction, and a plurality of initialization signal lines arranged along the first direction and extending along a second direction. An end of each initialization signal line is coupled to a connection line in the at least one connection line. The first direction and the second direction intersect. A first conductive connection line in the at least one first conductive connection line is coupled to at least two initialization signal lines, and the at least two initialization signal lines are coupled to a same connection line.

In some embodiments, forming the active pattern layer on the base substrate includes: forming at least one semi-conductive connection line on the base substrate; and conductorizing the at least one semi-conductive connection line to obtain the active pattern layer including the at least one first conductive connection line.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1A:
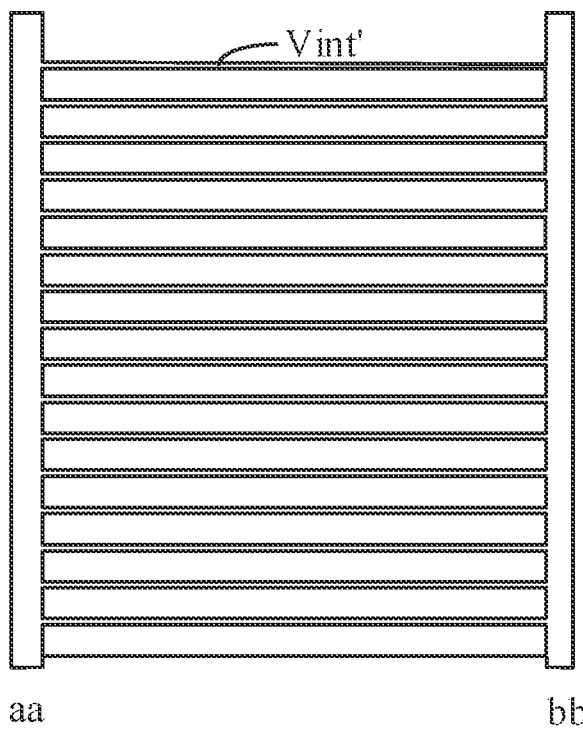
FIG. 1A is a structural diagram of a display panel in related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic designations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

A plurality of patterns are "arranged in the same layer", which means that the plurality of patterns belong to a same pattern layer. That is, the plurality of patterns are formed by a same patterning process. The patterning process is a process capable of synchronously forming the plurality of patterns on a bearing surface. For example, the plurality of patterns are made of an organic material, and the patterning process may be an evaporation or printing process. For another example, the plurality of patterns are made of a metal material. In this case, the patterning process may include: forming a film by using a film forming process; then, patterning the film to form the pattern layer including the plurality of patterns. The patterning process may include photoresist coating, exposure, development, and etching processes. It will be noted that at least part of the plurality of patterns may be connected, or spaced apart from each other. In addition, the plurality of patterns may have different thicknesses (or heights). For example, a plurality of layers shown in the drawings in the embodiments may be pattern layers, such as an active pattern layer, a first conductive layer, and a second conductive layer.

Some display panels, such as OLED display panels, each include pixel driving circuits and initialization signal lines. The initialization signal lines are configured to transmit initialization signals to the pixel driving circuits. Referring to FIG. 1A, the initialization signal line Vint' may be led out from an integrated circuit (IC), and may extend from a side as of a display panel to another side bb opposite thereto. In the related art, in a process of transmitting the initialization signal from the initialization signal line to the pixel driving circuits coupled to the initialization signal line, due to voltage drops across the initialization signal line, the transmitted signal is gradually attenuated during transmission, so that the signals respectively transmitted to the pixel driving circuits finally are inaccurate, which results in a non-uniform brightness of a display image.

In addition, for a display device with a camera shooting or sensing function, a hole (i.e., a physical hole) needs to be punched at a specific position of a display panel, so as to ensure that light is capable of entering a camera or a sensing device through the display panel. The physical hole disconnects part of the initialization signal lines, and the voltage drops across the disconnected initialization signal line are further increased, so that normal light emission of sub-pixels located on two sides of the physical hole is affected, which results in a non-uniform lateral display of the display panel.

Figure 1B:
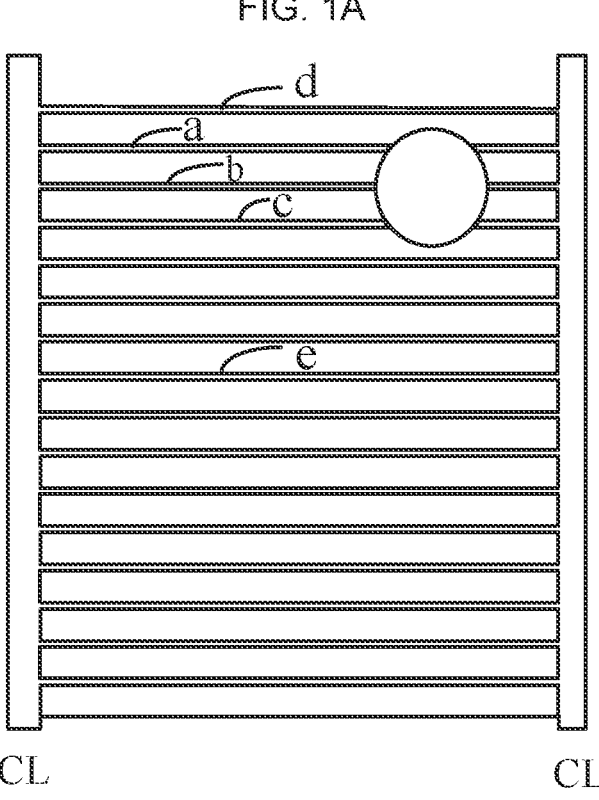
FIG. 1B is a structural diagram of another display panel in the related art.

Referring to FIG. 1B, an edge of the physical hole in the display panel is shown with a circle, and initialization signal lines a, b, and c are the above disconnected initialization signal lines. In addition, the display panel further includes several continuous initialization signal lines, such as initialization signal lines d and e in FIG. 1B. Since the initialization signal lines a, b, and c are disconnected at the physical hole, and ends of the disconnected initialization signal line extending to the physical hole cannot be connected to connection lines CL respectively located on two opposite sides of the display panel, so that the voltage drops across the disconnected initialization signal line are greater than the voltage drops across the continuous initialization signal line. A large voltage drop across the initialization signal line causes the initialization signal transmitted by the initialization signal line to be attenuated. The attenuated initialization signal is written into a corresponding pixel driving circuit, so that a charging rate of the pixel driving circuit is reduced. For example, from a side of the display panel to the edge of the physical hole, the charging rates of the pixel driving circuits are gradually decreased, so that at the macroscopic level, a horizontal stripe with a gradually changed brightness, i.e., the non-uniform lateral display, occurs.

To solve the above problems, some embodiments of the present disclosure provide a display device. The display device is a product with an image display function. For example, the display device may be a display, a television, a billboard, a digital photo frame, a laser printer with a display function, a telephone, a mobile phone, a personal digital assistant (PDA), a digital camera, a camcorder, a viewfinder, a navigator, a vehicle, a large-area wall, a home appliance, an information inquiry equipment (e.g., a business inquiry equipment of an e-government department, a bank, a hospital or a power department), or a monitor.

The display device usually includes a display panel. For example, the display panel may be an organic light-emitting diode (OLED) display panel, a quantum dot light-emitting diode (QLED) display panel, or a micro LED (including Mini LED or Micro LED) display panel. In addition, the display device may further include other components, such as a power supply system for supplying power to the display panel and a circuit board connected to the display panel.

Figure 2A:
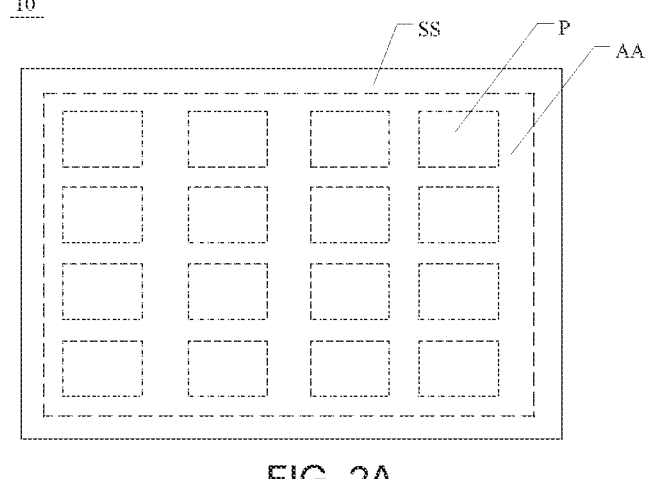
FIG. 2A is a structural diagram of a display panel, in accordance with some embodiments of the present disclosure.

FIG. 2A is a top view of the display panel provided in some embodiments of the present disclosure. The display panel 10 has a display area AA and a peripheral area SS located on at least one side of the display area AA. FIG. 2A shows that the peripheral area SS is arranged around the display area AA, but is not limited thereto. For example, the peripheral area SS may be arranged only on a single side of the display area AA. The display panel 10 further includes a plurality of sub-pixels P disposed in the display area AA. For example, the plurality of sub-pixels P may be arranged in an array as shown in FIG. 2A, so as to form a plurality of sub-pixel rows and a plurality of sub-pixel columns. Of course, the number and arrangement of the sub-pixels P are not limited to those shown in the drawings, and may be designed according to needs.

Figure 2B:
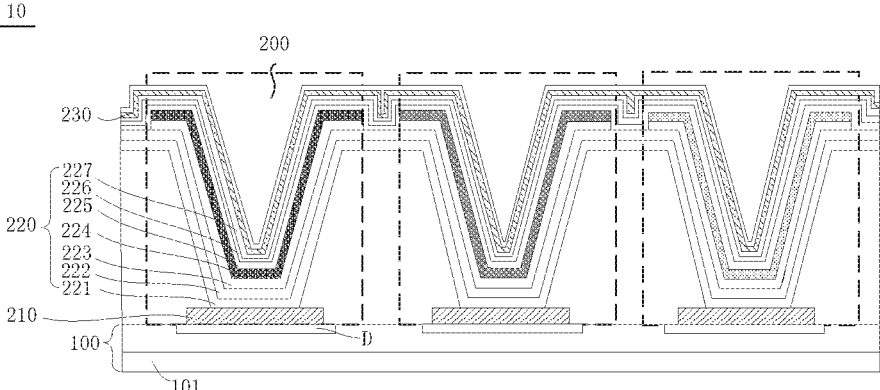
FIG. 2B is a sectional view of the display panel in FIG. 2A.

FIG. 2B shows the display panel provided in some embodiments of the present disclosure. The display panel 10 may include a driving backboard 100 and a plurality of light-emitting devices 200. For example, the driving backboard 100 includes a base substrate 101 and a plurality of pixel driving circuits D disposed on the base substrate 101. Each pixel driving circuit D is coupled to a light-emitting device 200 to form a sub-pixel P, and the pixel driving circuit D is configured to drive the light-emitting device 200 coupled thereto to emit light. The plurality of pixel driving circuits D may be arranged in order on the base substrate 101. For example, the plurality of pixel driving circuits D are arranged in an array on the base substrate 101.

The light-emitting device 200 is a main structure of the sub-pixel P to realize light emission, and each light-emitting device 200 may have a structure in which a plurality of films are stacked. For example, the light-emitting device 200 includes a cathode 230, an anode 210, and a light-emitting functional layer 220 located between the cathode 230 and the anode 210. The light-emitting functional layer 220 may include, for example, a light-emitting layer 224, a hole transport layer 222 located between the light-emitting layer 224 and the anode 210, and an electron transport layer located between the light-emitting layer 224 and the cathode 230. Of course, according to needs, in some embodiments, a hole injection layer 221 may further be provided between the hole transport layer 222 and the anode 210, and an electron injection layer 227 may further be provided between the electron transport layer 226 and the cathode 230. In addition, an electron blocking layer 223 may further be provided between the hole transport layer 222 and the light-emitting layer 224, and a hole blocking layer 225 may further be provided between the electron transport layer 226 and the light-emitting layer 224.

Figure 3A:
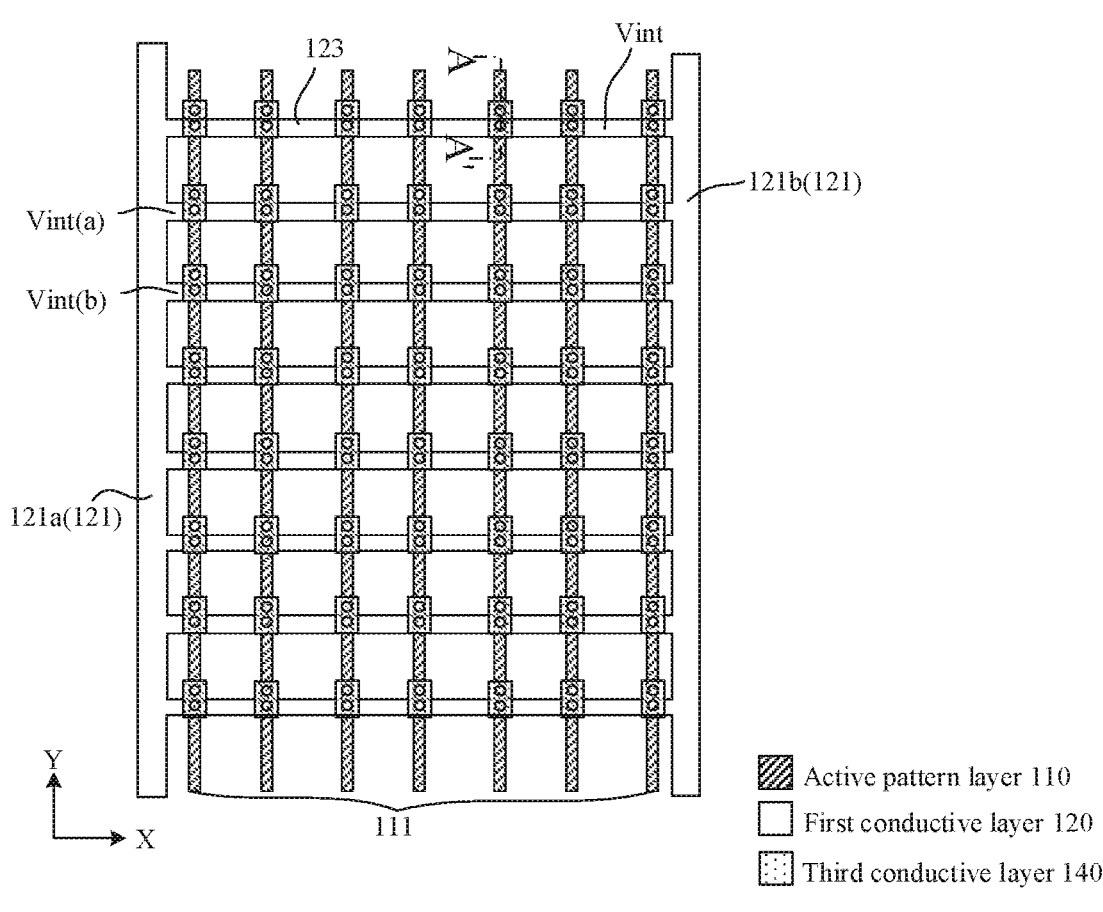
FIG. 3A is a top view of a display panel, in accordance with some embodiments of the present disclosure.

FIG. 3A is a top view of the driving backboard 100 in the display panel provided in some embodiments of the present disclosure. The driving backboard 100 may include a plurality of layers, and each layer in the driving backboard 100 is shown in FIG. 3A with a different fill pattern.

For example, the driving backboard 100 includes an active pattern layer 110 and a first conductive layer 120. The active pattern layer 110 is disposed on the base substrate 101, and the first conductive layer 120 is disposed on a side of the active pattern layer 110 away from the base substrate 101. For example, after the active pattern layer 110 is formed on the base substrate 101, an insulating layer (which is referred to as a first insulating layer 103) may be firstly formed on the side of the active pattern layer 110 away from the base substrate. Then, the first conductive layer 120 is formed on a side of the first insulating layer 103 away from the active pattern layer 110. In this way, the active pattern layer 110 and the first conductive layer 120 may be spaced apart by the first insulating layer 103.

Referring to FIG. 3A, the active pattern layer 110 in the driving backboard 100 includes at least one first conductive connection line 111. A conductorization process is a process to increase a conductivity of an object with a poor conductivity after a certain treatment. The poor conductivity is a relative concept. For example, a conductivity of an insulator is poor compared to a semiconductor or conductor, and a conductivity of the semiconductor is poor compared to the conductor. For example, the conductorization process may be a doping process. For example, the first conductive connection line 111 in the driving backboard 100 may be obtained by doping a semi-conductive connection line. A material for forming the semi-conductive connection line may be polysilicon.

The number of the first conductive connection line(s) 111 in the active pattern layer 110 may be one or more. For example, the active pattern layer 110 includes a plurality of first conductive connection lines 111, and may further include other conductive patterns or semi-conductive patterns. The semi-conductive patterns may be used for forming gates of transistors, and the conductive patterns may be used for forming sources or drains of the transistors.

A shape of the first conductive connection line 111 is not limited in the embodiments of the present disclosure, and may be designed according to needs. For example, the first conductive connection line 111 may be in a shape of a straight strip, a wave, or a broken line. In a case where the first conductive connection line 111 is in the shape of the wave or the broken line, the first conductive connection line 111 may include a plurality of periodic repeating line segments, and an extending direction of a line connecting corresponding positions of the repeating line segments may be an extending direction of the first conductive connection line 111. In a case where there are a plurality of first conductive connection lines 111, extending directions of the plurality of first conductive connection lines 111 may be substantially parallel to each other. For example, an included angle between extending directions of any two first conductive connection lines 111 does not exceed 5 degrees. The extending directions of the first conductive connection lines 111 may be designed according to needs.

Referring to FIG. 3A again, the first conductive layer 120 in the driving backboard 100 includes at least one connection line 121 extending along a first direction Y, and a plurality of initialization signal lines Vint arranged along the first direction Y and extending along a second direction X. An end of each initialization signal line Vint is coupled to a connection line 121. The first direction Y and the second direction X intersect.

For example, the first direction Y is a vertical direction, and the second direction X is a horizontal direction. In a case where the first direction Y and the second direction X intersect, an included angle between the first direction Y and the second direction X is a right angle. Of course, specific directions of the first direction Y and the second direction X are not limited in the embodiments of the present disclosure. For example, the included angle formed by the intersection of the first direction Y and the second direction X may be an acute angle or an obtuse angle.

The initialization signal lines in the display panel are configured to transmit respective initialization signals, and the initialization signals may come from an integrated circuit (IC) of the display device. For example, the connection line(s) 121 may be located in the peripheral area SS of the display panel 10, and the at least one connection line 121 is coupled to a signal supply circuit (e.g., IC) of the display device. When the display device 10 displays an image, the at least one connection line 121 may receive the initialization signals from the IC, and may transmit the received initialization signals to the sub-pixels P of the display panel 10. For example, the display panel includes a single connection line, such as 121*a* or 121*b* in FIG. 3A, and this connection line receives the initialization signals provided by the IC. For another example, the display panel includes two connection lines 121*a* and 121*b*. The connection line 121*a* may receive the initialization signals provided by the IC. Of course, only the connection line 121*b* may receive the initialization signals provided by the IC. Alternatively, the connection lines 121*a* and 121*b* each receive the initialization signals from the IC.

In a case where the first conductive layer 120 includes a single connection line 121, all of the initialization signal lines Vint in the display panel are coupled to this connection line. In a case where the first conductive layer 120 includes a plurality of connection lines 121, the initialization signal line Vint may be coupled to at least one of the plurality of connection lines 121. For example, an initialization signal line Vint is coupled to a single connection line 121. For example, the display panel includes the two connection lines 121*a* and 121*b*, and an initialization signal line Vint may be coupled to only the connection line 121*a*, or coupled to only the connection line 121*b*, so that the display panel may include initialization signal lines coupled to only the connection line 121*a* and initialization signal lines coupled to only the connection line 121*b*. For another example, an initialization signal line Vint is coupled to two connection lines 121. For example, referring to FIG. 3A, an end of an initialization signal line Vint is coupled to the connection line 121*a*, and another end of the initialization signal line Vint is coupled to the connection line 121*b*. For the convenience of description below, an initialization signal line coupled to a single connection line is referred to as a first initialization signal line, and an initialization signal line with two ends respectively coupled to connection lines is referred to as a second initialization signal line.

A connection line 121 may transmit initialization signals, through respective initialization signal lines Vint coupled thereto, to the sub-pixels P (the sub-pixels P are shown in FIG. 2A) in the display panel 10 coupled to those initialization signal lines Vint. For example, an initialization signal line Vint may be coupled to sub-pixels P. For example, the sub-pixels P coupled to the initialization signal line Vint may be sub-pixels in a same row. Each sub-pixel P is coupled to the initialization signal line Vint through one or more nodes in the pixel driving circuit D, so as to initialize a voltage of the one or more nodes in the pixel driving circuit.

A first conductive connection line is coupled to at least two initialization signal lines Vint, and the at least two initialization signal lines Vint are coupled to a same connection line 121.

For example, a first conductive connection line 111 is coupled to two initialization signal lines Vint. For example, a first conductive connection line 111 in FIG. 3A is coupled to initialization signal lines Vint(a) and Vint(b). In a case where the initialization signal line Vint(a) and the initialization signal line Vint(b) are coupled together through the first conductive connection line 111, the initialization signal line Vint(a) and the initialization signal line Vint(b) are connected in parallel, and an equivalent resistance formed by the parallel connection is less than a resistance of any one of the initialization signal line Vint(a) and the initialization signal line Vint(b). Thus, voltage drops across each initialization signal line (Vint(a) or Vint(b)) are reduced compared to a case that the initialization signal line Vint(a) and the initialization signal line Vint(b) are not connected in parallel, and signal losses of the initialization signal line (Vint(a) or Vint(b)) are reduced accordingly.

When the voltage drops across the initialization signal line are reduced, differences between initialization signals received by the sub-pixels P coupled to this initialization signal line are reduced. For example, the initialization signals (i.e., initial voltages) received by the pixel driving circuits coupled to this initialization signal line are almost equal, so that a voltage of a corresponding node in each pixel driving circuit reaches a preset voltage value after initialization, or only has a small deviation from the preset voltage value. In this way, a charging rate of each pixel driving circuit is almost the same, so that a difference in light-emitting brightness of each sub-pixel is reduced.

In the embodiments of the present disclosure, the at least one first conductive connection line 111 is disposed in the active pattern layer 110, and a first conductive connection line 111 is coupled to at least two initialization signal lines Vint, so that the at least two initialization signal lines Vint are connected in parallel, and an equivalent resistance of the initialization signal lines Vint connected in parallel is less than a resistance of each initialization signal line Vint. Thus, voltage drops across each initialization signal line Vint may be reduced. After the voltage drops across the initialization signal line Vint are reduced, the attenuations of the initialization signal transmitted by the initialization signal line Vint are also reduced, so that the initialization signals respectively written into the sub-pixels are more accurate, and thus the non-uniform display of the display panel is avoided, thereby improving the display quality of the display device.

Figure 3B:
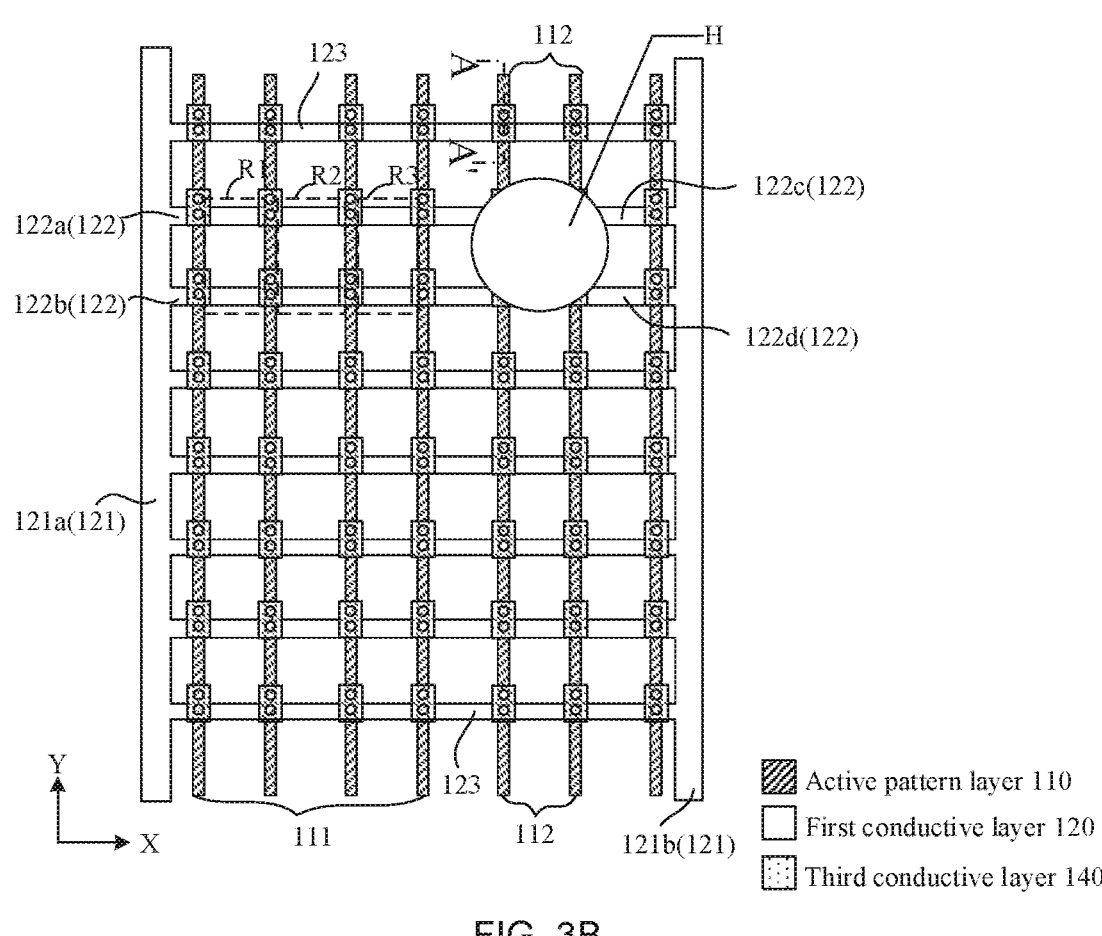
FIG. 3B is a top view of another display panel, in accordance with some embodiments of the present disclosure.

FIG. 3B is a top view of another driving backboard 100 in the display panel provided in some embodiments of the present disclosure. The driving backboard 100 includes through hole(s) H. The through hole H is a hole penetrating two opposite sides of the driving backboard 100 in a thickness direction of the driving backboard 100, and a size and position of the hole may be designed according to needs. There may be a plurality of through holes in the driving backboard 100, and in a case where the driving backboard 100 includes the plurality of through holes H, a position and an arrangement of each through hole may be designed according to actual situations. A description will be made in an example where the driving backboard includes a single through hole H in the embodiments of the present disclosure.

Referring to FIG. 3B again, the first conductive layer 120 in the driving backboard 100 includes at least one connection line 121 extending along the first direction Y, and a plurality of first initialization lines 122 arranged along the first direction Y and extending along the second direction X. The first initialization signal line 122 is one of the initialization signal lines Vint. An end of each first initialization signal line 122 is coupled to a connection line 121, and another end of the first initialization signal line 122 extends to the through hole H. The first direction Y and the second direction X intersect.

For example, the first conductive layer 120 includes a plurality of connection lines 121 extending along the first direction Y. For example, referring to FIG. 3B, the first conductive layer 120 includes a connection line 121*a* and a connection line 121*b*, and the connection lines 121*a* and 121*b* may be respectively disposed on two opposite sides of the driving backboard 100 in the second direction X. For example, the connection line 121a and the connection line 121b are disposed in the peripheral area SS and respectively located on two opposite sides of the display panel 10 in the second direction X. Referring to FIG. 3B, the first conductive layer 120 further includes the plurality of first initialization signal lines 122 arranged along the first direction Y and extending along the second direction X. The first initialization signal lines 122 may be disconnected lines due to the through hole H, so that the number of the disconnected lines depends on a size of the through hole H. Since each row of sub-pixels in the display panel are connected to an initialization signal line extending in the second direction X, a distance between two adjacent initialization signal lines extending in the second direction X is substantially equal to a dimension of a row of sub-pixels in the first direction Y (or a width, in the first direction Y, of a row of sub-pixels arranged along the second direction X). For example, in a case where sub-pixel rows (the number thereof is denoted as N, N≥2; e.g., N=9, or N=15) are removed due to the through hole H, first initialization signal lines 122 (the number thereof is denoted as M, M≥2; e.g., M=N, or M=N+1, or M=N−1) are connected to a connection line 121. FIG. 3B only schematically shows first initialization signal lines 122a, 122b, 122c and 122d included in the first conductive layer 120. The first initialization signal lines 122a and 122b are connected to the same connection line 121a, and are arranged at an interval along the first direction Y. The first initialization signal lines 122c and 122d are connected to the same connection line 121b, and are arranged at an interval along the first direction Y. In addition, distances, each of which is a distance between two adjacent first initialization signal lines 122 in the second direction X, may be equal or unequal.

The end of each first initialization signal line 122 is coupled to the connection line 121, and the another end of the first initialization signal line 122 extends to the through hole H. For example, referring to FIG. 38, an end of the first initialization signal line 122a (or 122b) may be coupled to the left connection line 121a, and another end of the first initialization signal line 122a (or 122b) extends to the through hole H. An end of the first initialization signal line 122c (or 122d) may be coupled to the right connection line 121b, and another end of the first initialization signal line 122c (or 122d) extends to the through hole H.

A first conductive connection line 111 is coupled to at least two first initialization signal lines 122, and the at least two first initialization signal lines 122 are coupled to a same connection line 121. An equivalent resistance formed by two first initialization signal lines 122 coupled by a first conductive connection line 111 is less than a resistance of any one of the two first initialization signal lines 122, so that voltage drops across each of the two first initialization signal lines 122 are reduced, which is conducive to ensuring an accuracy of a signal transmitted by each of the two first initialization signal lines.

In sub-pixels P coupled to a first initialization signal line 122, due to the voltage drops across the first initialization signal line, a pixel driving circuit in a sub-pixel closest to the connection line has a highest charging rate, and a pixel driving circuit in a sub-pixel closest to the through hole H has a lowest charging rate. In a light-emitting phase, the sub-pixel closest to the connection line is brightest, the sub-pixel closest to the through hole is darkest, and sub-pixels in the middle each have a brightness between a brightness of the brightest sub-pixel and a brightness of the darkest sub-pixel. After the voltage drops across the first initialization signal line are reduced, a brightness of each sub-pixel is closer to the brightness of the brightest sub-pixel, so that a brightness difference between the brightest sub-pixel and the darkest sub-pixel is reduced. For the display device, a gradually changed brightness from a side of the display device to the through hole becomes less obvious.

In some embodiments, the active pattern layer 110 includes a plurality of first conductive connection lines 111, and each first conductive connection line 111 is coupled to at least two initialization signal lines Vint. An arrangement of the plurality of first conductive connection lines 111 is not limited in the embodiments of the present disclosure, and may be designed according to needs. For example, referring to FIGS. 3A and 3B, the plurality of first conductive connection lines 111 may be arranged in parallel.

For example, referring to FIG. 3B, by taking the first initialization signal lines as an example, the first initialization signal lines 122a and 122b are coupled by first conductive connection lines 111 located between the connection line 121a and the through hole H. A portion of the first initialization signal line 122a and a portion of the first initialization signal line 122b between every two adjacent first conductive connection lines 111 may be regarded as a parallel relationship. For example, resistances, each of which is a resistance formed between every two adjacent first conductive connection lines 111 by connecting a portion of the first initialization signal line 122a and a portion of the first initialization signal line 122b in parallel, are respectively R1, R2, R3 shown by the dashed boxes in FIG. 3B. R1, R2, and R3 are in parallel with each other. In this way, the first initialization signal line 122a and the first initialization signal line 122b located between the connection line 121a and the through hole H are connected in parallel several times, and an equivalent resistance thereof is further reduced compared to the case that the first initialization signal line 122a and the first initialization signal line 122b are connected in parallel only once, so that the voltage drops across each of the first initialization signal lines 122a, 122b are lower compared to the case that the first initialization signal line 122a and the first initialization signal line 122b are coupled through a single first conductive connection line 111. Then, the initialization signals written into the pixel driving circuits through the first initialization signal lines 122a, 122b are more accurate.

In some embodiments, referring to FIG. 3B, the first conductive layer 120 includes two connection lines 121a and 121 b arranged opposite to each other. The first conductive layer 120 further includes a plurality of second initialization signal lines 123 arranged in the first direction Y and extending in the second direction X. The second initialization signal line 123 is one of the initialization signal lines Vint. Two ends of each second initialization signal line 123 are respectively coupled to the two connection lines 121. In a case where the two ends of the second initialization signal line 123 are respectively coupled to the connection lines 121, voltage drops across the second initialization signal line 123 is extremely small or almost zero.

For example, the plurality of second initialization signal lines 123 may be arranged at certain intervals on two sides of the first initialization signal line 122. For example, the second initialization signal lines 123 in FIG. 3B are located on upper and lower sides of the through hole, and each second initialization signal line 123 is arranged at an equal distance. Moreover, a distance between a second initialization signal line 123 and a first initialization signal line 122 is also equal.

Each first conductive connection line 111 is further coupled to at least one second initialization signal line 123. For example, each first conductive connection line 111 is coupled to a second initialization signal line 123 in addition to the at least two first initialization signal lines 122. Since the voltage drops across the second initialization signal line are extremely small or almost zero, in a case where at least two first initialization signal lines 122 are coupled to a second initialization signal line 123, the at least two first initialization signal lines 122 are connected in parallel with the second initialization signal line 123, and the voltage drops across each first initialization signal line 122 after the parallel connection are less than the voltage drops across the second initialization signal line 123, so that the voltage drops across the first initialization signal line 122 may be greatly reduced.

For another example, each first conductive connection line 111 may be coupled to second initialization signal lines 123 in addition to the at least two first initialization signal lines 122. The more the second initialization signal lines 123 to which each first conductive connection line 111 is coupled, the more the second initialization signal lines 123 with which each first initialization signal line 122 is connected in parallel, and the smaller the voltage drops across each first initialization signal line 122 after the parallel connection. For example, each first conductive connection line 111 is coupled to each second initialization signal line 123 in the driving backboard. In this case, the voltage drops across each first initialization signal line 122 may be minimized. For another example, a first conductive connection line 111 is coupled to several second initialization signal lines 123 in the driving backboard. That is, the number of the second initialization signal lines 123 to which the at least one first conductive connection line 111 is coupled is less than the total number of the second initialization signal lines 123 in the driving backboard.

In some embodiments, referring to FIG. 38, the active pattern layer 110 further includes at least one second conductive connection line 112, and each second conductive connection line 112 is coupled to at least two second initialization signal lines 123. In a case where at least two second initialization signal lines 123 are coupled through a second conductive connection line 112, the at least two second initialization signal lines 123 may be connected in parallel. In a case where at least two second initialization signal lines 123 are coupled through a plurality of second conductive connection lines 112, the at least two second initialization signal lines 123 may be connected in parallel several times, so that the voltage drops across each second initialization signal line 123 are further reduced. A principle of the parallel connection of the at least two second initialization signal lines 123 is the same as that of the parallel connection of the at least two first initialization signal lines 122, and will not be repeated here.

Some embodiments of the present disclosure provide the driving backboard 100, and the driving backboard 100 is provided with the plurality of pixel driving circuits.

A specific structure of the pixel driving circuit is not limited in the embodiments of the present disclosure, and may be designed according to actual situations. For example, the pixel driving circuit is composed of electronic devices such as thin film transistors (TFT) and capacitor(s) (C). For example, the pixel driving circuit may include two thin film transistors (i.e., a switching transistor and a driving transistor) and a capacitor, which form a 2T1C structure. Of course, the pixel driving circuit may further include more than two thin film transistors (i.e., a plurality of switching transistors and a driving transistor) and at least one capacitor. For example, the pixel driving circuit may include a capacitor and seven thin film transistors, which form a 7T1C structure.

Figure 4A:
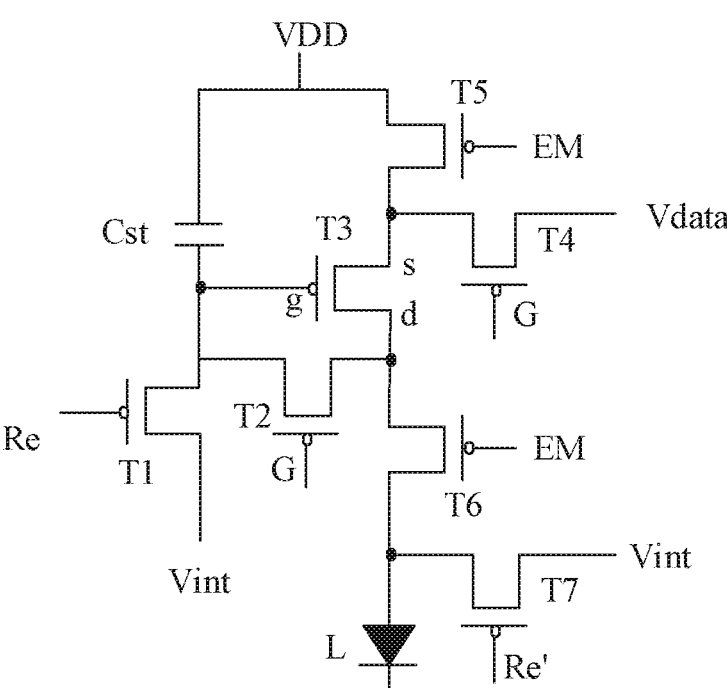
FIG. 4A is an equivalent circuit diagram of a pixel driving circuit in the related art.

Hereinafter, a structure of the pixel driving circuit will be described by taking the pixel driving circuit of the 7T1C structure as an example. Referring to FIG. 4A, FIG. 4A shows an equivalent circuit diagram of the pixel driving circuit of the 7T1C structure. The pixel driving circuit includes a capacitor Cst, a plurality of switching transistors (T1, T2, T4, T5, T6, T7) and a driving transistor T3. The letters (Vint, Re, Re', G, EM, Vdata, VDD) in the figure each represent a signal line coupled to a corresponding transistor. For example, Vint represents an initialization signal line, Re represents a first reset signal line, Re' represents a second reset signal line, G represents a scan control signal line, EM represents a light-emitting control signal line, Vdata represents a data signal line, and VDD represents a power signal line. A signal transmitted by Re' is the same as a signal transmitted by G.

For example, as shown in FIG. 4A, a control electrode (i.e., a gate) of part (e.g., T1) of the switching transistors is coupled to the first reset signal line Re for receiving a first reset signal. A control electrode (i.e., a gate) of part (e.g., T7) of the switching transistors is coupled to the second reset signal line Re' for receiving a second reset signal. Control electrodes of another part (e.g., T2 and T4) of the switching transistors are coupled to the scan control signal line G for receiving a scan control signal. The second reset signal is the same as the scan control signal. Control electrodes of yet another part (e.g., T5 and T6) of the switching transistors are coupled to the light-emitting control signal line EM for receiving a light-emitting control signal. For example, the transistor T1 is turned on in response to the first reset signal, and the transistor T7 is turned on in response to the second reset signal, so that the initialization signal (transmitted by the initialization signal line Vint) is transmitted to a control electrode (g) of the driving transistor T3 and an anode of a light-emitting device L respectively through the transistor T1 and the transistor T7, so as to reset the anode of the light-emitting device L and the control electrode of the driving transistor T3. Under a control of the scan control signal (transmitted by the scan control signal line G), the transistors T2 and T4 are turned on, so that the control electrode g and a drain (d) of the driving transistor T3 are coupled, and thus the driving transistor T3 is a diode that is in an on state. In this case, through the transistors T2 and T4, a data signal (transmitted by the data signal line Vdata) is written into a source (s) of the driving transistor T3, and a threshold voltage of the driving transistor T3 is compensated. Under a control of the light-emitting control signal (transmitted by the light-emitting control signal EM), the transistor T5 and the transistor T6 are turned on, so that a driving current is transmitted to the light-emitting device L through the above current path, so as to drive the light-emitting device L to emit light. For example, an electrode (e.g., anode) of the light-emitting device L receives the driving current from the pixel driving circuit, and another electrode (e.g., cathode) of the light-emitting device L is coupled to a fixed voltage terminal. For example, the fixed voltage terminal is configured to transmit a direct voltage, such as a direct low voltage.

Figure 4B:
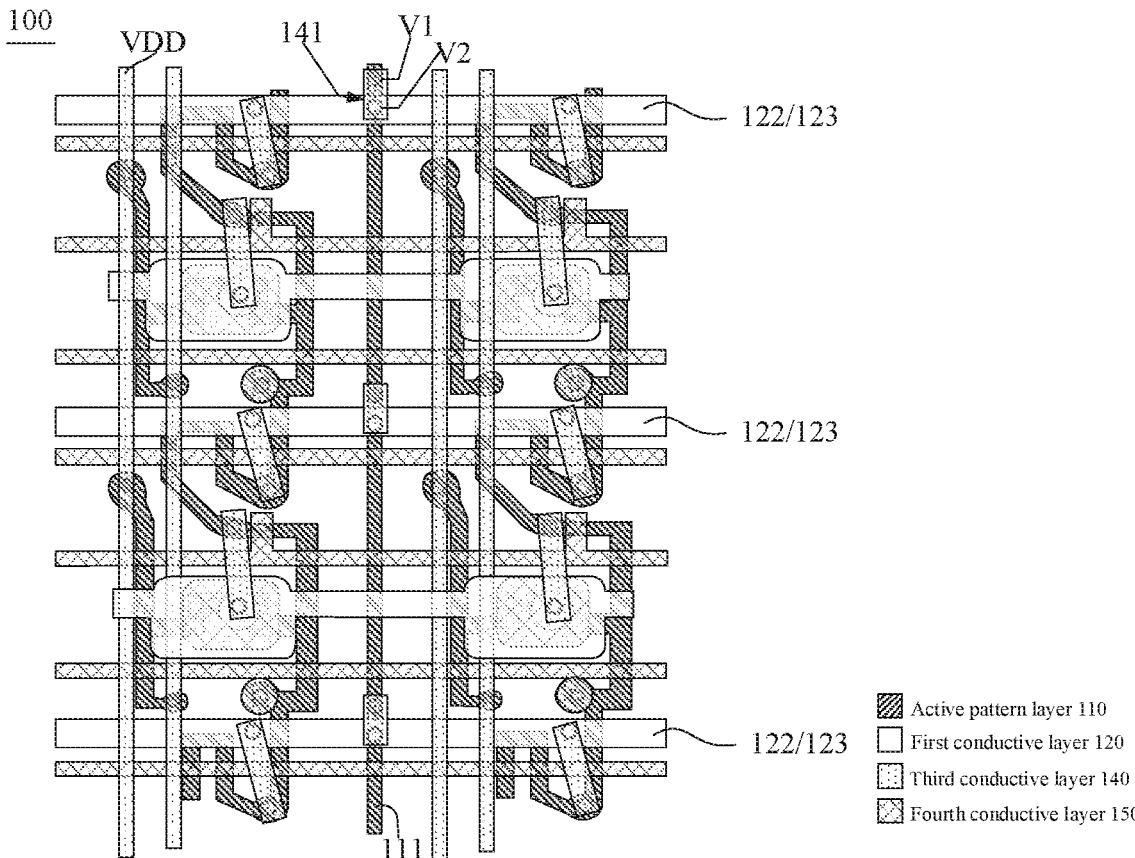
FIG. 4B is a top view of yet another display panel, in accordance with some embodiments of the present disclosure.

FIG. 4B is a structural diagram of the pixel driving circuit of the 7T1C structure on the driving backboard. The driving backboard is formed by stacking a plurality of pattern layers. For example, the driving backboard includes the base substrate, and the active pattern layer 110, a fourth conductive layer 150, the first conductive layer 120 and a third conductive layer 140 that are formed on the base substrate in sequence. FIGS. 5A to 5D sequentially show specific structures of the pattern layers.

Figure 5A:
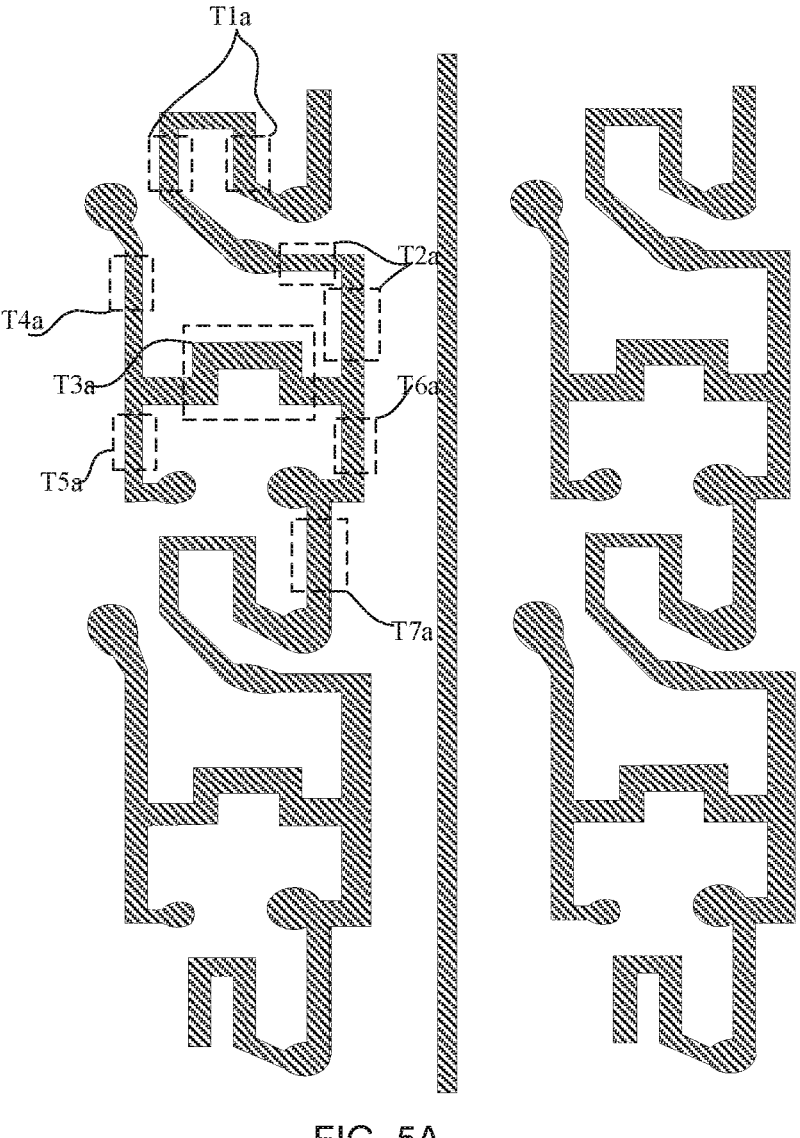
FIG. 5A is a structural diagram of a pattern layer in the display panel in FIG. 4B.

FIG. 5A shows a specific structure of the active pattern layer in the driving backboard. The active pattern layer includes active layers T1a of switching transistors T1, active layers T2a of switching transistors T2, active layers T4a of switching transistors T4, active layers T5a of switching transistors T5, active layers T6a of switching transistors T6, active layers T7a of switching transistors T7 and active layers T3a of driving transistors T3 in the plurality of pixel driving circuits, as shown by the dashed boxes in FIG. 5A (a single pixel driving circuit is taken as an example).

Figure 5B:
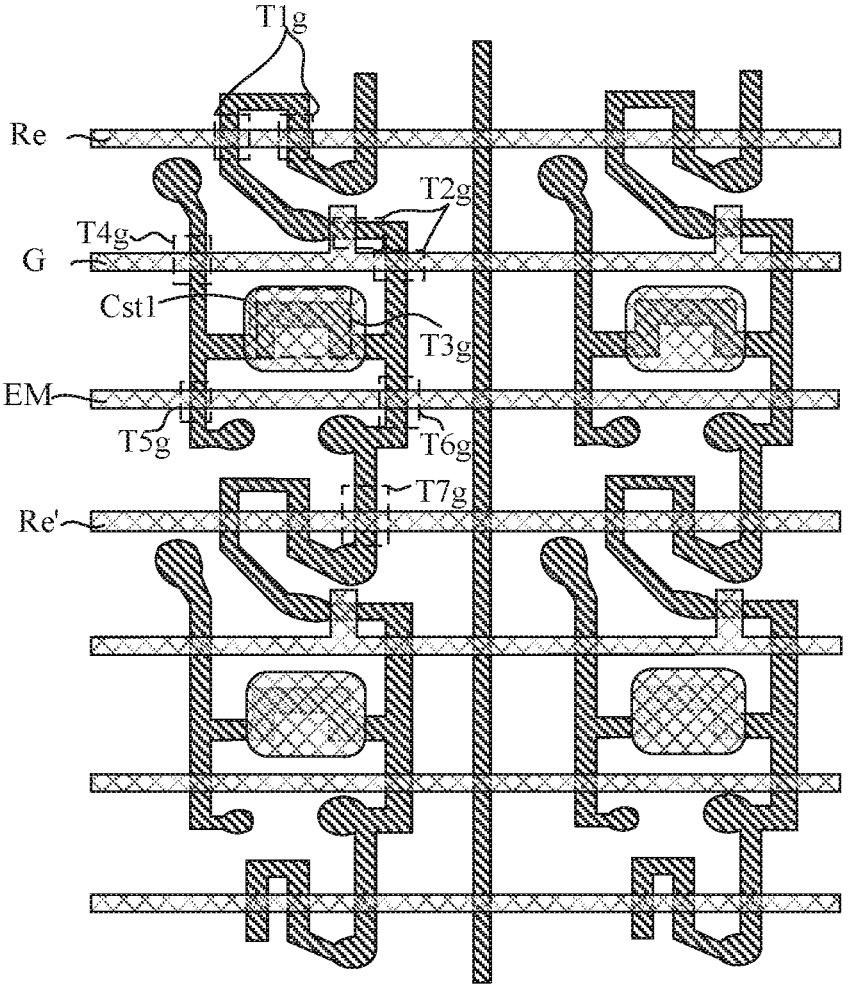
FIG. 5B is a structural diagram of two pattern layers in the display panel in FIG. 4B.

FIG. 5B further shows a specific structure of the fourth conductive layer in the driving backboard. Gates T1g of the switching transistors T1, gates T2g of the switching transistors T2, gates T4g of the switching transistors T4, gates T5g of the switching transistors T5, gates T6g of the switching transistors T6, gates T7g of the switching transistors T7 and gates T3g of the driving transistors T3 may be formed in the fourth conductive layer 150. In addition, first reset signal lines Re, second reset signal lines Re' scan control signal lines G, light-emitting control signal lines EM, and first plates Cst1 of capacitors Cst in the plurality of pixel driving circuits may be further formed in the fourth conductive layer accordingly.

Figure 5C:
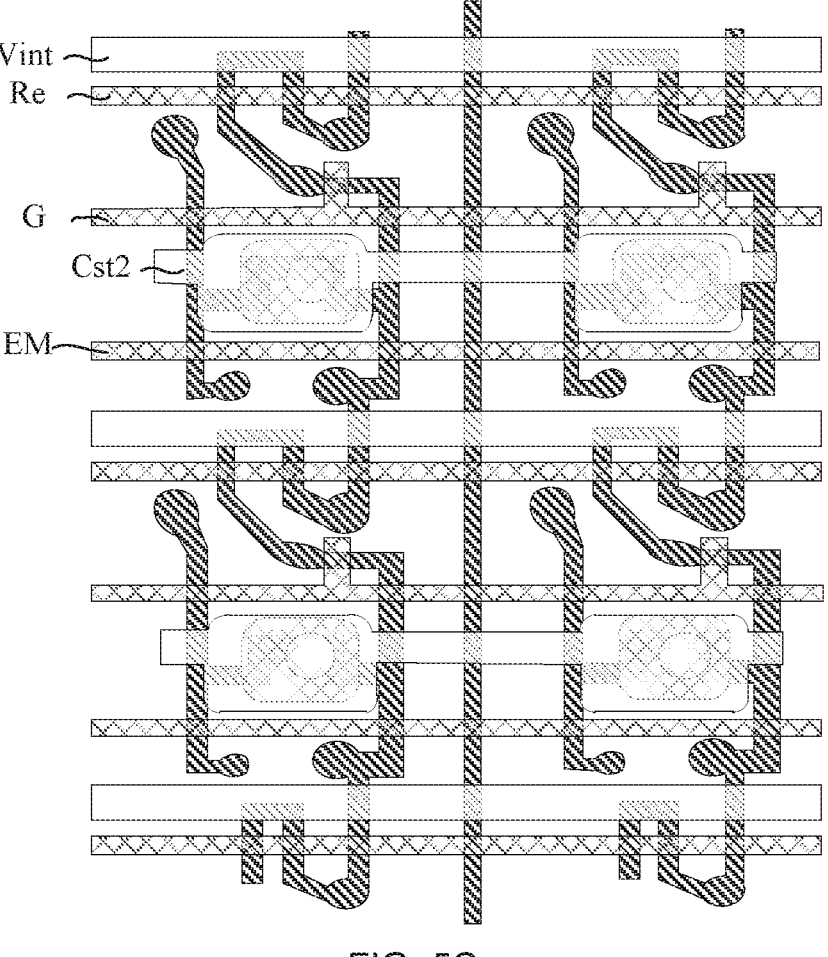
FIG. 5C is a structural diagram of three pattern layers in the display panel in FIG. 4B.

FIG. 5C further shows a specific structure of the first conductive layer in the driving backboard. The initialization signal lines Vint may be formed in the first conductive layer. For example, the connection line(s) and the first initialization signal lines in the embodiments of the present disclosure may be formed in the first conductive layer. In addition, second plates Cst2 of the capacitors Cst may be further formed in the first conductive layer.

Figure 5D:
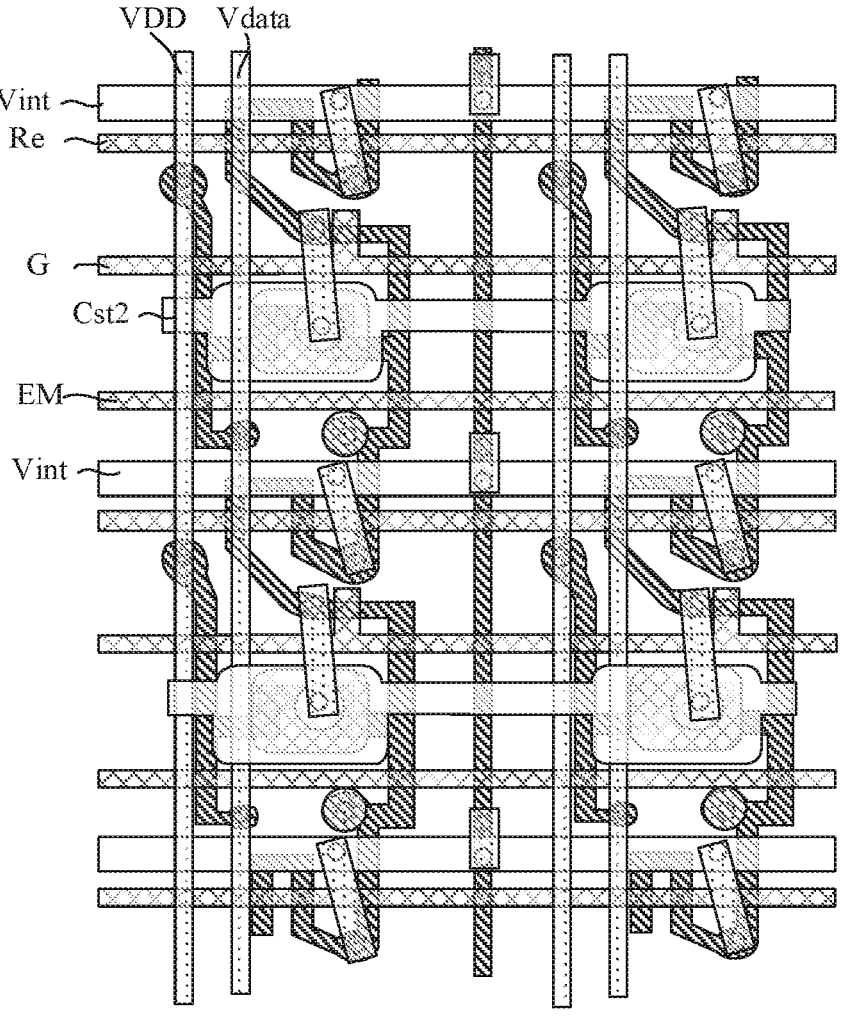
FIG. 5D is a structural diagram of four pattern layers in the display panel in FIG. 4B.

FIG. 5D further shows a specific structure of the third conductive layer in the driving backboard. Sources and drains of the switching transistors and the driving transistors in the plurality of pixel driving circuits may be formed in the third conductive layer. In addition, power signal lines VDD and data signal lines Vdata may be further formed in the third conductive layer.

Figure 3C:
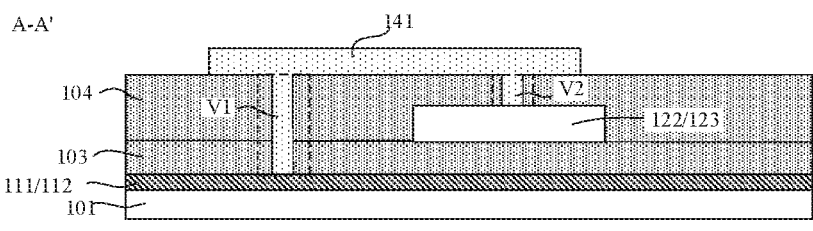
FIG. 3C is a sectional view taken along the A-A' line in FIG. 3B.

In some embodiments, referring to FIG. 3C, the driving backboard 100 further includes at least one first connection pattern 141 disposed on a side of the first conductive layer 120 away from the base substrate 101. A first conductive connection line 111 or a second conductive connection line 112 is coupled to an initialization signal line Vint through a first connection pattern 141.

For example, a first conductive connection line 111 is coupled to a first initialization signal line 122 through a first connection pattern 141.

For example, the first connection pattern(s) 141 may be disposed in the third conductive layer 140. The third conductive layer 140 may be disposed on the side of the first conductive layer 120 away from the base substrate 101. The first conductive layer 120 and the third conductive layer 140 may be spaced apart by a second insulating layer 104. Referring to FIGS. 3B, 3C and 4B, in a case where the first conductive connection line 111 is coupled to the first initialization signal line 122 through the first connection pattern 141, a first via V1 and a second via V2 may be formed first after the second insulating layer 104 is formed. The first via V1 penetrates the second insulating layer 104 and the first insulating layer 103 to reach the first conductive connection line 111, and the second via V2 penetrates the second insulating layer 104 to reach the first initialization signal line 122. Then, when the first connection pattern 141 is formed, the first connection pattern 141 may fill both the first via V1 and the second via V2, so as to couple the first conductive connection line 111 to the first initialization signal line 122.

The first connection pattern(s) 141 may be manufactured by one patterning process by using a mask for manufacturing other patterns in the third conductive layer 140, which may save a mask, compared with a case that a via is punched in the first insulating layer 103 after the first insulating layer 103 is formed, and then the first initialization signal line 122 in the first conductive layer 120 is formed, so that the first conductive connection line 111 in the active pattern layer 110 is coupled to the first initialization signal line 122 in the first conductive layer 120 through this via in the first insulating layer 103. Thus, the manufacturing cost of the driving backboard is reduced.

Similarly, a first conductive connection line 111 and a second initialization signal line 123 may be coupled through a first connection pattern 141, and a coupling method and beneficial effects thereof are the same as the above description of the first initialization signal line 122, which will not be repeated here.

In some embodiments, a coupling point where a first connection pattern and an initialization signal line are coupled is located at a position where a first conductive connection line coupled to this first connection pattern and this initialization signal line cross.

For example, referring to FIG. 4B, a coupling point where a first connection pattern 141 and a first initialization signal line 122 are coupled is located at a position where a first conductive connection line 111 coupled to this first connection pattern 141 and this first initialization signal line 122 cross.

The coupling point where the first connection pattern 141 and the first initialization signal line 122 are coupled needs to be located on this first initialization signal line 122, so that the second via V2 may reach the first initialization signal line 122. For example, the coupling point where the first connection pattern 141 and the first initialization signal line 122 are coupled may be the second via V2. In a case where the coupling point is located at a position except the position where the first initialization signal line 122 and the first conductive connection line 111 cross, the first connection pattern 141 may be made into a shape of "L". In a case where the coupling point is located at the position where the first initialization signal line 122 and the first conductive connection line 111 cross, the first connection pattern 141 may be made into a shape of "1". Obviously, the first connection pattern 141 is made into the shape of "1", which occupies a smaller area in the third conductive layer 140, and is conducive to miniaturization design of the sub-pixels, compared with the case that the first connection pattern 141 is made into the shape of "L".

Similarly, a coupling point where a first connection pattern 141 and a second initialization signal line 123 are coupled is located at a position where a first conductive connection line 111 coupled to this first connection pattern 141 and this second initialization signal line 123 cross, and beneficial effects thereof are the same as the above description of the first initialization signal line 122, which will not be repeated here.

In some embodiments, the first conductive connection line 111 extends along the first direction Y, and is in the shape of the straight strip. The first conductive connection line 111 with the shape of the straight strip has a simple shape, and is easy to manufacture, which is conducive to improving a yield in a production process of the driving backboard.

In some embodiments, the driving backboard further includes a second conductive layer disposed between the base substrate and the active pattern layer. The second conductive layer includes at least one conductive line extending along a third direction. A conductive line and an initialization signal line are coupled through at least two coupling points.

Figure 6:
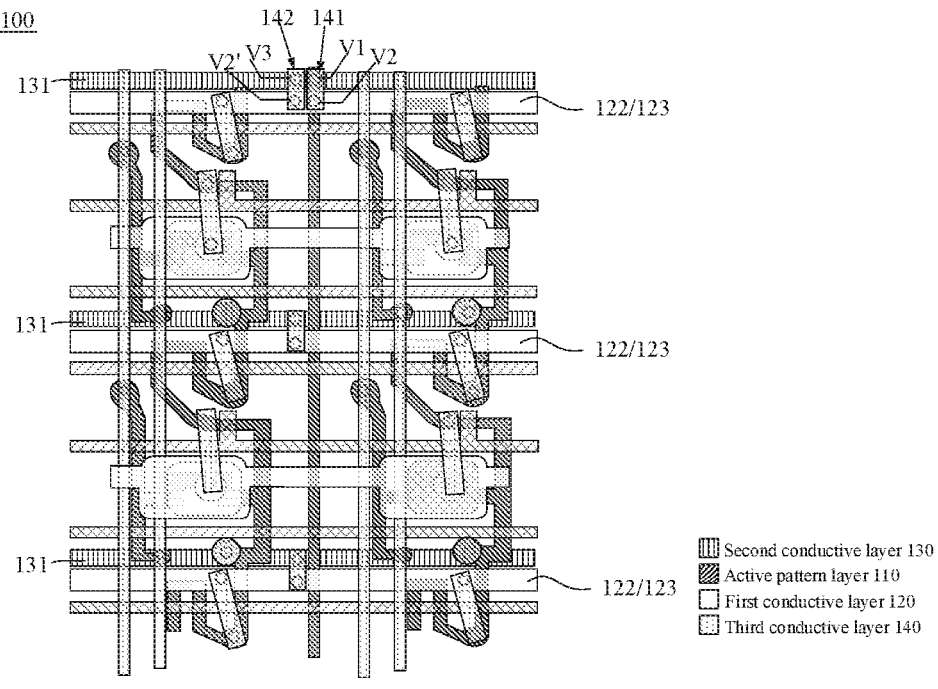
FIG. 6 is a top view of yet another display panel, in accordance with some embodiments of the present disclosure.

For example, referring to FIG. 6, the driving backboard 100 further includes the second conductive layer 130. The second conductive layer 130 is disposed between the base substrate 101 and the active pattern layer 110. The second conductive layer 130 includes the at least one conductive line 131 extending along the third direction. A conductive line 131 and a first initialization signal line 122 are coupled through at least two coupling points. In the at least two coupling points, at least one coupling point is located on this conductive line 131, and at least one coupling point is located on this first initialization signal line 122.

Similarly, a conductive line 131 and a second initialization signal line 123 are coupled through at least two coupling points, and a coupling method thereof may refer to the above description of the first initialization signal line 122, which will not be repeated.

The third direction and the first direction Y may intersect, or the third direction and the second direction X may intersect. The third direction may be parallel to one of the first direction Y or the second direction X.

In some embodiments, the third direction is parallel to the second direction X. In this case, the conductive line 131 in the driving backboard 100 may be parallel to the first initialization signal line 122 or the second initialization signal line 123.

In some embodiments, the driving backboard further includes at least one second connection pattern disposed on the side of the first conductive layer away from the base substrate. A conductive line and an initialization signal line are coupled through a second connection pattern. For example, referring to FIG. 6, the driving backboard 100 further includes the at least one second connection pattern 142 disposed on the side of the first conductive layer 120 away from the base substrate 101. A conductive line 131 and a first initialization signal line 122 are coupled through a second connection pattern 142.

For example, the second connection pattern 142 may be arranged in the same layer as the first connection pattern 141. For example, the second connection pattern 142 is located in the third conductive layer 140.

Figure 7:
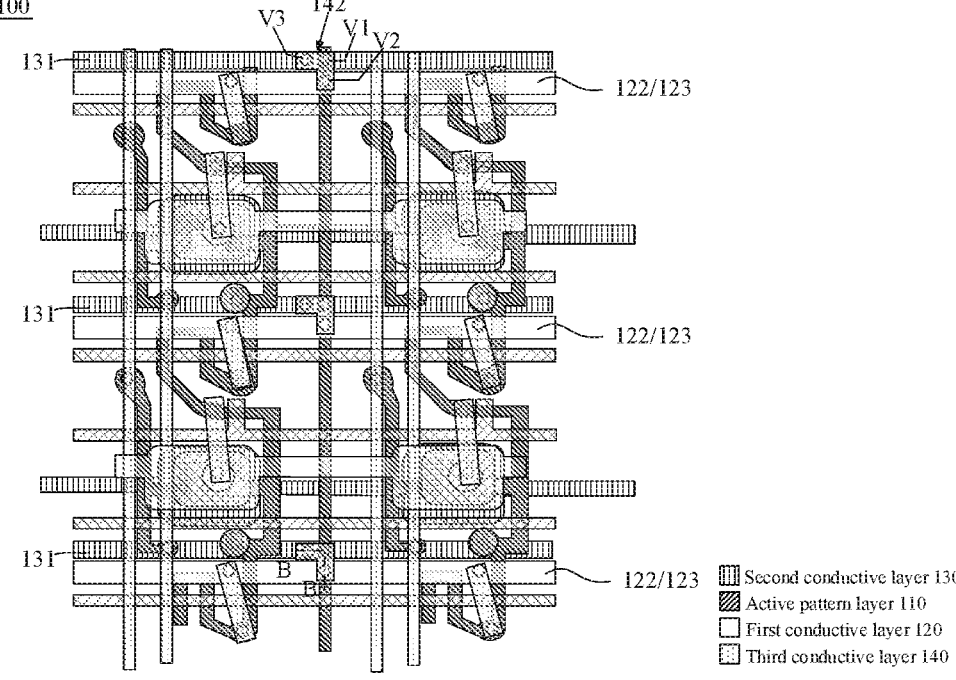
FIG. 7 is a top view of yet another display panel, in accordance with some embodiments of the present disclosure.
Figure 8:
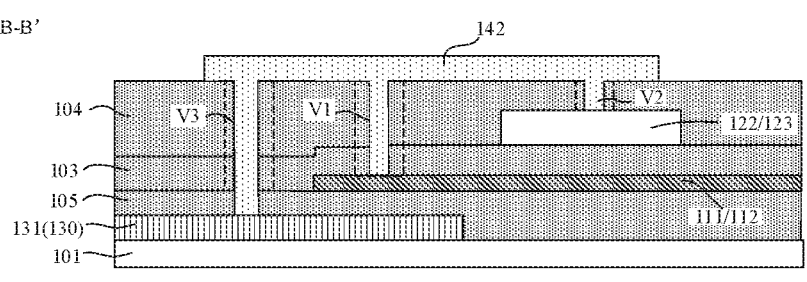
FIG. 8 is a sectional view taken along the B-B' line in the display panel shown in FIG. 7.

For example, referring to FIGS. 7 and 8, after the second conductive layer 130 is formed, a buffer layer 105 may be formed on a side of the second conductive layer 130 away from the base substrate 101. Then, the active pattern layer 110 and the first conductive layer 120 are formed on a side of the buffer layer 105 away from the base substrate 101. After the second insulating layer 104 is formed, referring to FIG. 6, a third via V3 may be formed while forming a second via V2'. The third via V3 penetrates the second insulating layer 104, the first insulating layer 103 and the buffer layer 105 to reach the conductive line 131. Then, when the third conductive layer 140 is formed, the second connection pattern(s) 142 may be formed. The second connection pattern 142 may fill both the second via V2' and the third via V3, so as to couple the conductive line 131 to the first initialization signal line 122. In this case, the coupling points where the conductive line 131 and the first initialization signal line 122 are coupled may be, for example, the second via V2' and the third via V3, respectively.

Similarly, a conductive line 131 and a second initialization signal line 123 are coupled through a second connection pattern 142, and a coupling method thereof may refer to the above description of the first initialization signal line 122, which will not be repeated.

In some embodiments, the second conductive layer 130 includes a plurality of conductive lines 131. Each first initialization signal line 122 is coupled to a conductive line 131, and each second initialization signal line 123 is coupled to a conductive line 131.

In some embodiments, a first conductive connection line, an initialization signal line, and a conductive line are coupled through a second connection pattern. For example, referring to FIG. 7, a first conductive connection line 111, a first initialization signal line 122 and a conductive line 131 are coupled through a second connection pattern 142. For example, referring to FIG. 8, the connection pattern 142 may fill the first via V1, the second via V2 and the third via V3.

Similarly, a first conductive connection line 111, a second initialization signal line 123 and a conductive line 131 are coupled through a second connection pattern 142, and a coupling method thereof is the same as the above description of the first initialization signal line 122, which will not be repeated.

In some embodiments, the active pattern layer 110 further includes a plurality of active layers. The plurality of active layers may be part or all of the active layers in the active pattern layer 110.

Figure 9:
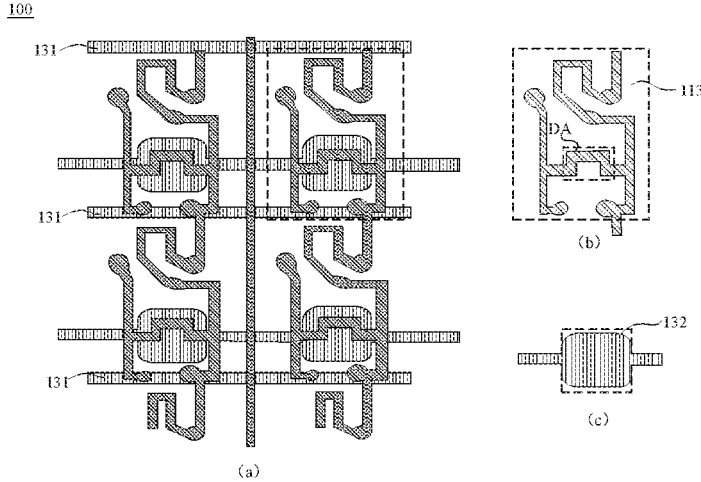
FIG. 9 is a structural diagram of yet another display panel, in accordance with some embodiments of the present disclosure.

For example, referring to FIG. 9, the active pattern layer 110 includes a plurality of active patterns 113, and each active pattern 113 includes active layers. For example, in the pixel driving circuit of the 7T1C structure, each active pattern 113 may include seven active layers, and one of the seven active layers is the active layer DA of the driving transistor. For example, the plurality of active layers in the active pattern layer 110 may include the active layers DA of all the driving transistors in the active pattern layer 110.

The second conductive layer 130 further includes a plurality of light-shielding patterns 132. An orthographic projection of an active layer (e.g., each of the plurality of active layers) on the base substrate 101 is located within an orthographic projection of a light-shielding pattern 132 on the base substrate.

For example, an orthographic projection of the active layer DA of each driving transistor in the active pattern layer 110 on the base substrate 101 is located within an orthographic projection of a light-shielding pattern 132 on the base substrate.

For the display device with an infrared imaging function, the display device usually includes an infrared imaging component usually located on a side of the display panel in a thickness direction of the display panel in the display device. For example, the infrared imaging component is located on a side of the display panel proximate to the base substrate. When the infrared imaging component operates, infrared rays emitted from the infrared imaging component irradiate the display panel, which results in transistor characteristic shifts of the transistors in the driving backboard of the display panel, so that the display panel generates bright spots. The light-shielding patterns 132 in the second conductive layer 130 in the driving backboard may shield the infrared rays, which may prevent the infrared rays from continuously irradiating the active layers DA of the driving transistors, so that the characteristic shifts of the driving transistors are avoided to some extent, thereby improving the display quality of the display panel.

In some embodiments, the driving backboard 100 further includes the power signal lines VDD disposed on the side of the first conductive layer 120 away from the base substrate 101. The plurality of light-shielding patterns 132 are coupled to the power signal lines VDD.

Figure 10:
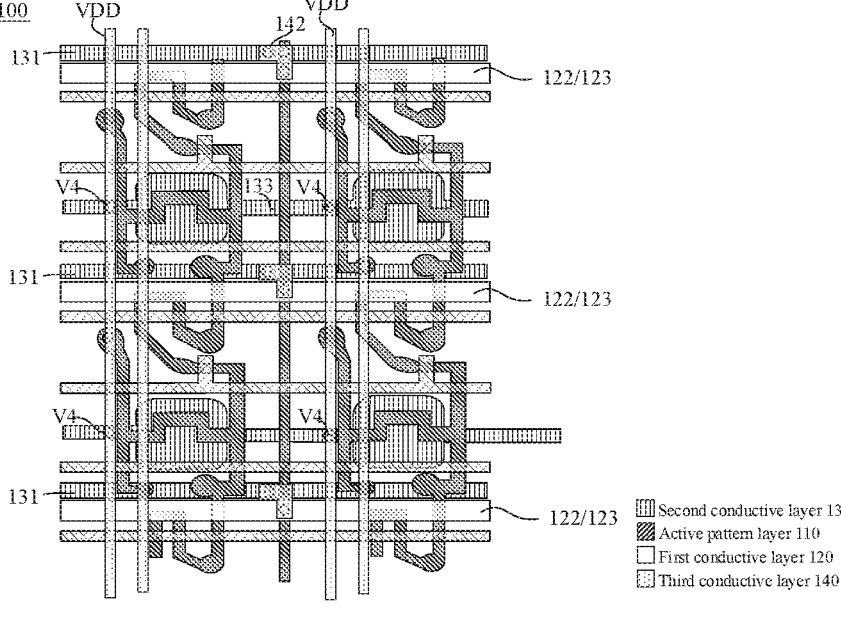
FIG. 10 is a top view of yet another display panel, in accordance with some embodiments of the present disclosure.

For example, the power signal lines VDD may be arranged in the same layer as the first connection pattern(s) 141. For example, the power signal lines VDD are located in the third conductive layer 140. The plurality of light-shielding patterns 132 may be coupled to the power signal lines VDD through vias. For example, referring to FIG. 10, light-shielding patterns 132 in a same row in the driving backboard 100 may be connected end to end, and a connection line 133 between two adjacent light-shielding patterns 132 may be coupled to a power signal line VDD through a fourth via V4. The fourth via V4 may be formed before the third conductive layer 140 is formed, and the fourth via V4 may penetrate the second insulating layer 104, the first insulating layer 103 and the buffer layer 105 to reach the connection line between the two adjacent light-shielding patterns 132.

In a case where the light-shielding pattern 132 is connected to a stable signal, for example, the light-shielding pattern 132 is connected to a signal provided from the power signal line VDD, so that substrate bias effect may be avoided, thereby avoiding a display problem due to an influence of the substrate bias effect on a corresponding driving transistor.

Figures 11, 12:
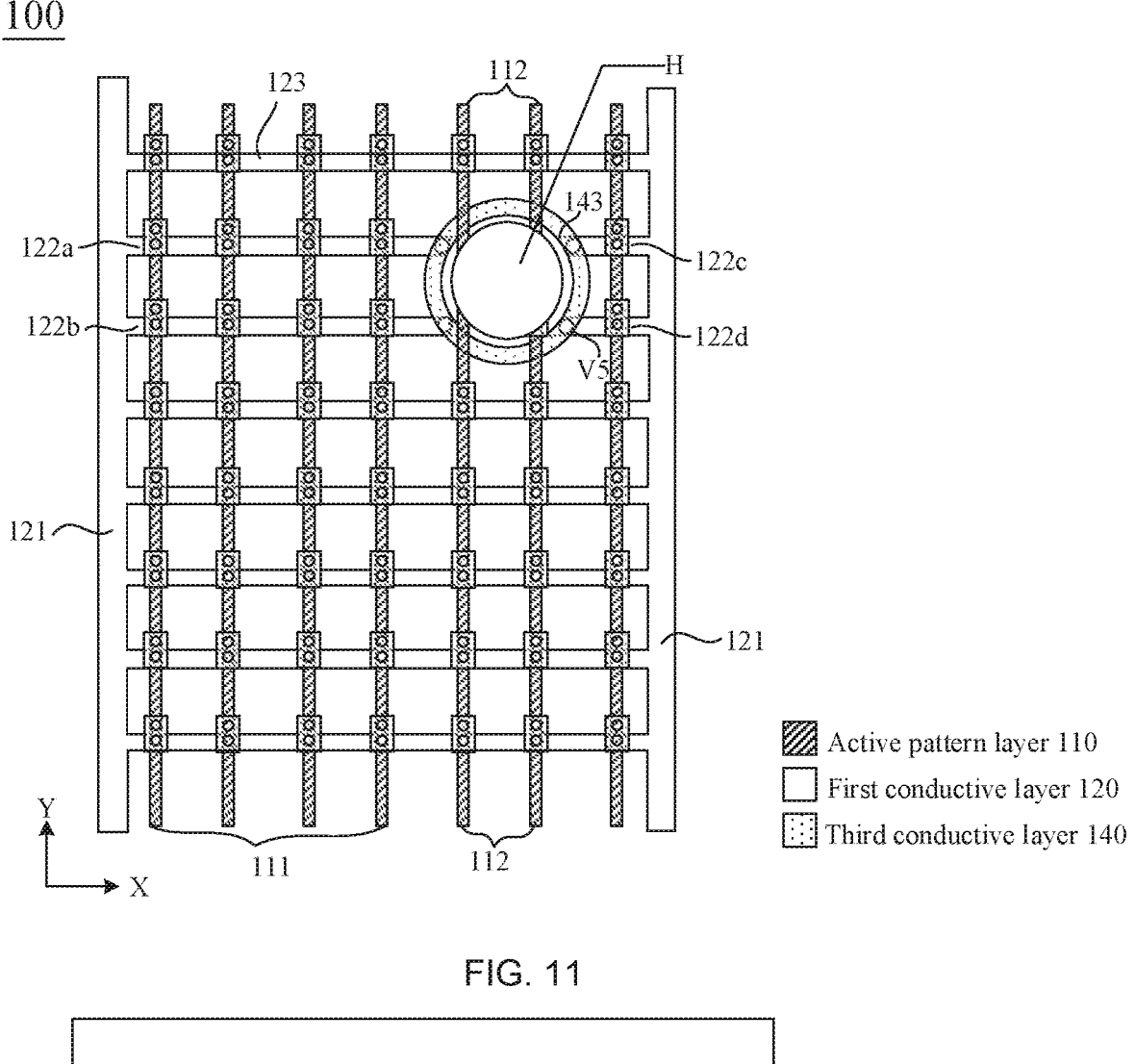
FIG. 11 is a top view of yet another display panel, in accordance with some embodiments of the present disclosure.
FIG. 12 is a flow diagram of a manufacturing method of a display panel, in accordance with some embodiments of the present disclosure.

In some embodiments, referring to FIG. 11, the driving backboard 100 further includes a third connection pattern 143 disposed on the side of the first conductive layer 120 away from the base substrate 101. The third connection pattern 143 is configured to be coupled to each first initialization signal line 122.

For example, the third connection pattern 143 may be arranged in the same layer as the first connection pattern(s) 141. For example, the third connection pattern 143 is located in the third conductive layer 140.

For example, the driving backboard 100 includes the first initialization signal lines 122a to 122d, and each first initialization signal line corresponds to a fifth via V5. The fifth via V5 may be formed before the third conductive layer 140 is formed, and the fifth via V5 penetrates the second insulating layer 104 to reach the first initialization signal line. The third connection pattern 143 fills the fifth via V5 that each first initialization signal line corresponds to, so that each first initialization signal line is coupled to the third connection pattern 143. In a case where the third connection pattern 143 couples the first initialization signal lines in the driving backboard 100, the voltage drops across each first initialization signal line may be further reduced.

Some embodiments of the present disclosure provide a manufacturing method of a display panel. Referring to FIG. 12, the manufacturing method mainly includes S1 and S2.

In S1, an active pattern layer is formed on a base substrate. The active pattern layer includes at least one first conductive connection line.

In S2, a first conductive layer is formed on a side of the active pattern layer away from the base substrate. The first conductive layer includes at least one connection line extending along a first direction, and a plurality of initialization signal lines arranged along the first direction and extending along a second direction. An end of each initialization signal line is coupled to a connection line. The first direction and the second direction intersect. A first conductive connection line is coupled to at least two initialization signal lines, and the at least two initialization signal lines are coupled to a same connection line.

In some embodiments, forming the active pattern layer on the base substrate in S1 includes: forming at least one semi-conductive connection line on the base substrate; and conductorizing the at least one semi-conductive connection line to obtain the active pattern layer including the at least one first conductive connection line. For example, S1 may include S101 to S103.

In S101, a plurality of semi-conductive patterns 112s and at least one semi-conductive connection line 111s are formed on the base substrate.

In S102, active layers in each semi-conductive pattern are covered by using a photoresist.

In S103, the covered semi-conductive patterns and the at least one semi-conductive connection line 111s are doped to form the active pattern layer including the at least one first conductive connection line 111.

Figure 13:
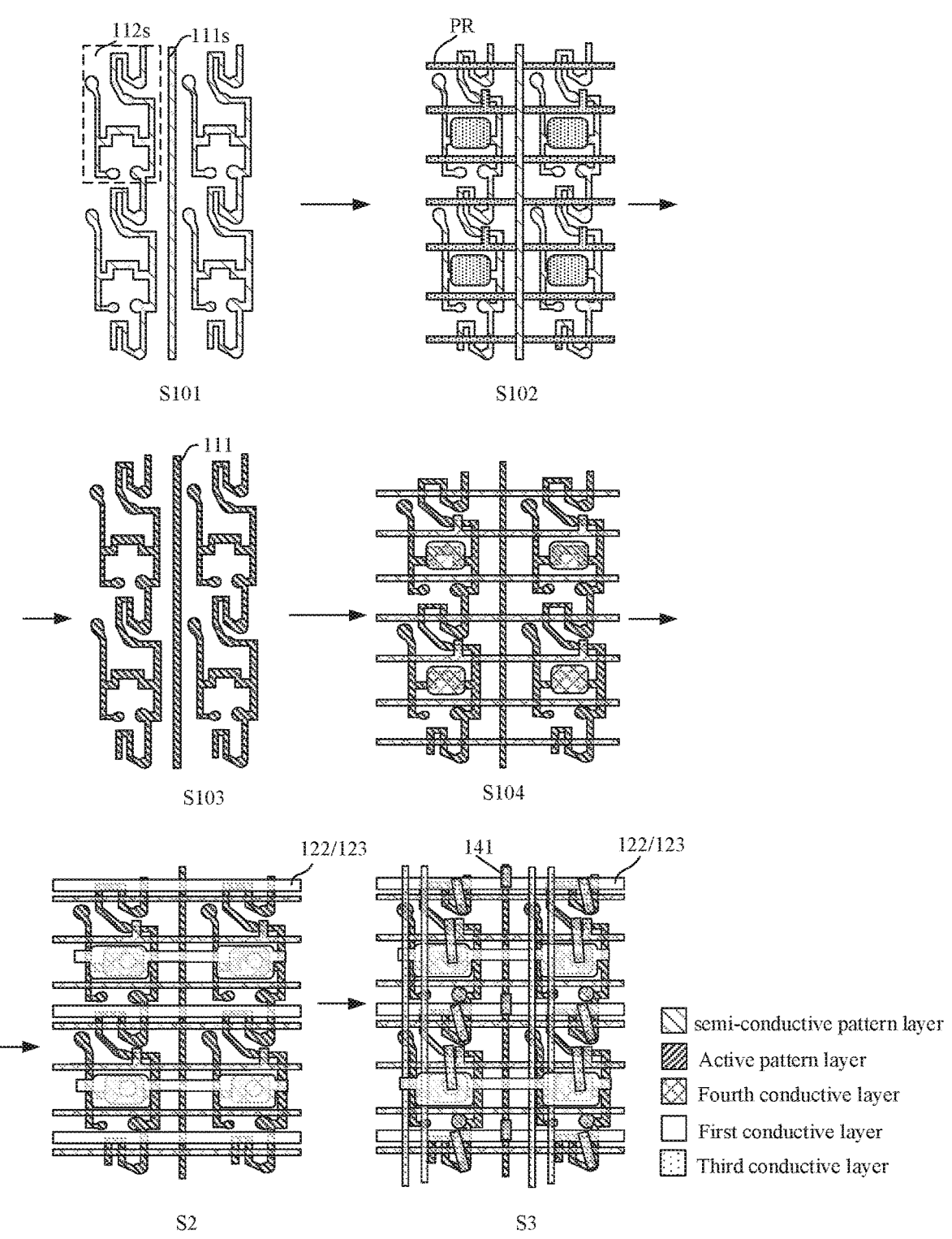
FIG. 13 is a process flow diagram of another manufacturing method of a display panel, in accordance with some embodiments of the present disclosure.

For example, referring to FIG. 13, the plurality of semi-conductive patterns 112s are arranged in an array, and each semi-conductive pattern 112s is located in a sub-pixel. Moreover, semi-conductive patterns located in a same column are connected end to end to constitute a column of semi-conductive patterns 112s. Each semi-conductive connection line 111 is may be located between two adjacent columns of semi-conductive patterns 112s.

In FIG. 13, S102 shows a structure in which the semi-conductive patterns are each partially covered by the photoresist PR. After the semi-conductive patterns 112s covered by the photoresist and the at least one semi-conductive connection line 111 is are doped, the active pattern layer including the at least one first conductive connection line 111 may be obtained.

In addition, after S101 to S103 are completed to form the active pattern layer, S2 and S3 may be continued. In S2, the first conductive layer is formed. The first conductive layer includes first initialization signal lines 122 and/or second initialization signal lines 123. In S3, a third conductive layer is formed. The third conductive layer includes first connection pattern(s) 141. In addition, before the first conductive layer is formed, a fourth conductive layer may be further formed through S104.

In the embodiments of the present disclosure, after a semi-conductive pattern layer (i.e., a pattern layer where the plurality of semi-conductive patterns 112s and the at least one semi-conductive connection line 111s are located) is formed, portions of the semi-conductive pattern layer respectively corresponding to channels of transistors are covered by using the photoresist, and an uncovered portion of the semi-conductive pattern layer is conductorized. The portions covered by the photoresist respectively form active layers of the transistors, and the portion uncovered by the photoresist forms a source-drain metal layer (i.e., a layer where sources and drains of the transistors are located) of the transistors. Compared with the related art in which the active layers of the transistors are firstly formed in the semi-conductive pattern layer, and then a portion of the semi-conductive pattern layer except the active layers of the transistors is doped to form the source-drain metal layer of the transistors, in the manufacturing method provided in the embodiments of the present disclosure, lattice damage caused by doping on the active layers of the transistors may be avoided. This is because an energy for doping on the active layers of the transistors is large, and annealing repair is required after doping, which damages the lattice.

Figure 14:
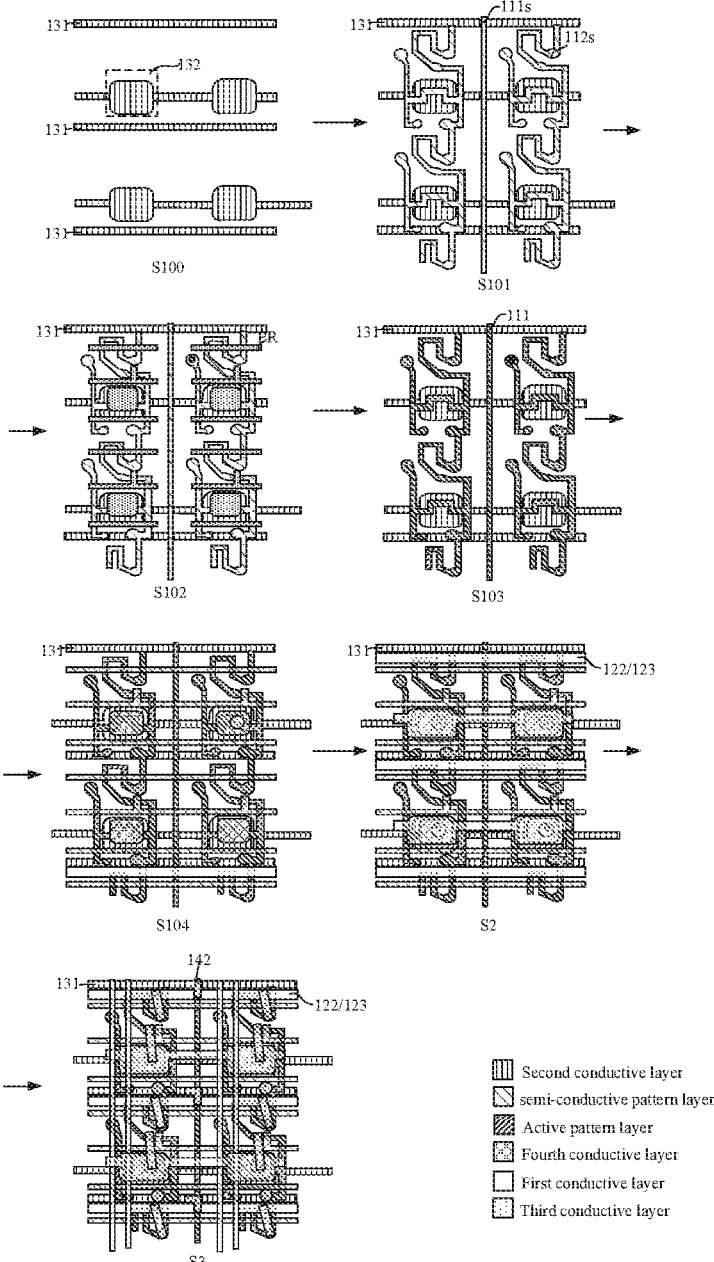
FIG. 14 is a process flow diagram of yet another manufacturing method of a display panel, in accordance with some embodiments of the present disclosure.

FIG. 14 is a process flow diagram of another display panel. In addition to S1 to S3 shown in FIGS. 12 and 13, S100 is further included. In S100, a second conductive layer is formed on the base substrate. The second conductive layer includes conductive line(s) 131. In some embodiments, the second conductive layer may further include light-shielding patterns 132. The third conductive layer further includes second connection pattern(s) 142.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a base substrate;
an active pattern layer disposed on the base substrate and including at least one first conductive connection line; and
a first conductive layer disposed on a side of the active pattern layer away from the base substrate; wherein the first conductive layer includes at least one connection line extending along a first direction, and a plurality of initialization signal lines arranged along the first direction and extending along a second direction; an end of each initialization signal line is coupled to a connection line in the at least one connection line; wherein the first direction and the second direction intersect; and
a first conductive connection line in the at least one first conductive connection line is coupled to at least two initialization signal lines, wherein the at least two initialization signal lines are coupled to a same connection line.

2. The display panel according to claim 1, wherein the at least one first conductive connection line includes a plurality of first conductive connection lines; wherein each first conductive connection line is coupled to at least two initialization signal lines that are coupled to a same connection line.

3. The display panel according to claim 1, wherein the display panel has a through hole;
the plurality of initialization signal lines include a plurality of first initialization signal lines, and another end of each first initialization signal line extends to the through hole; and
the first conductive connection line is coupled to at least two first initialization signal lines, wherein the at least two first initialization signal lines are coupled to the same connection line.

4. The display panel according to claim 3, wherein the at least one connection line includes two connection lines arranged opposite to each other;
the plurality of initialization signal lines further include a plurality of second initialization signal lines arranged along the first direction and extending along the second direction; wherein two ends of each second initialization signal line are respectively coupled to the two connection lines; and
each first conductive connection line is coupled to at least one second initialization signal line.

5. The display panel according to claim 4, wherein the active pattern layer further includes at least one second conductive connection line, and each second conductive connection line is coupled to at least two second initialization signal lines.

6. The display panel according to claim 1, further comprising:
at least one first connection pattern disposed on a side of the first conductive layer away from the base substrate; wherein
the first conductive connection line and an initialization signal line in the at least two initialization signal lines are coupled through a first connection pattern in the at least one first connection pattern.

7. The display panel according to claim 6, wherein a coupling point where the first connection pattern and the initialization signal line are coupled is located at a position where the first conductive connection line coupled to the first connection pattern and the initialization signal line cross.

8. The display panel according to claim 1, wherein the first conductive connection line extends along the first direction, and is in a shape of a straight strip.

9. The display panel according to claim 1, further comprising:
a second conductive layer disposed between the base substrate and the active pattern layer; wherein the second conductive layer includes at least one conductive line extending along a third direction; a conductive line in the at least one conductive line and an initialization signal line in the plurality of initialization signal lines are coupled through at least two coupling points.

10. The display panel according to claim 9, wherein the third direction is parallel to the second direction.

11. The display panel according to claim 9, further comprising:
at least one second connection pattern disposed on a side of the first conductive layer away from the base substrate; wherein
the conductive line and the initialization signal line are coupled through a second connection pattern in the at least one second connection pattern.

12. The display panel according to claim 11, wherein the first conductive connection line, the initialization signal line and the conductive line are coupled through the second connection pattern.

13. The display panel according to claim 9, wherein the active pattern layer further includes a plurality of active layers;
the second conductive layer further includes a plurality of light-shielding patterns;
wherein an orthographic projection of an active layer in the plurality of active layers on the base substrate is located within an orthographic projection of a light-shielding pattern in the plurality of light-shielding patterns on the base substrate.

14. The display panel according to claim 13, further comprising:
power signal lines disposed on a side of the first conductive layer away from the base substrate; wherein
the plurality of light-shielding patterns are coupled to the power signal lines.

15. The display panel according to claim 3, further comprising:
a third connection pattern disposed on a side of the first conductive layer away from the base substrate; wherein the third connection pattern is configured to be coupled to each first initialization signal line.

16. A display device, comprising the display panel according to claim 1.

17. A manufacturing method of a display panel, comprising:

forming an active pattern layer on a base substrate, the active pattern layer including at least one first conductive connection line; and forming a first conductive layer on a side of the active pattern layer away from the base substrate; wherein the first conductive layer includes at least one connection line extending along a first direction, and a plurality of initialization signal lines arranged along the first direction and extending along a second direction; an end of each initialization signal line is coupled to a connection line in the at least one connection line; wherein the first direction and the second direction intersect; a first conductive connection line in the at least one first conductive connection line is coupled to at least two initialization signal lines, wherein the at least two initialization signal lines are coupled to a same connection line.

18. The manufacturing method according to claim 17, wherein forming the active pattern layer on the base substrate includes:

forming at least one semi-conductive connection line on the base substrate; and conductorizing the at least one semi-conductive connection line to obtain the active pattern layer including the at least one first conductive connection line.

19. The display panel according to claim 2, wherein the display panel has a through hole;

the plurality of initialization signal lines include a plurality of first initialization signal lines, and another end of each first initialization signal line extends to the through hole; and each first conductive connection line is coupled to at least two first initialization signal lines that are coupled to the same connection line.

20. The display panel according to claim 2, further comprising:

at least one first connection pattern disposed on a side of the first conductive layer away from the base substrate; wherein each first conductive connection line and an initialization signal line coupled to this first conductive connection line are coupled through a first connection pattern in the at least one first connection pattern.

* * * * *